United States Patent
Lin et al.

(10) Patent No.: US 7,733,096 B2
(45) Date of Patent: Jun. 8, 2010

(54) METHODS OF TESTING FUSE ELEMENTS FOR MEMORY DEVICES

(75) Inventors: Sung-Chieh Lin, Hsinchu (TW); Po-Hung Chen, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 245 days.

(21) Appl. No.: 11/731,960

(22) Filed: Apr. 2, 2007

(65) Prior Publication Data

US 2008/0238439 A1    Oct. 2, 2008

(51) Int. Cl.
*G01R 31/02* (2006.01)

(52) U.S. Cl. .................. 324/550; 324/705; 365/96; 438/17

(58) Field of Classification Search ............ 324/550; 438/467; 365/225.7
See application file for complete search history.

(56) References Cited

U.S. PATENT DOCUMENTS

| | | | |
|---|---|---|---|
| 4,228,528 A * | 10/1980 | Cenker et al. ............. 365/200 |
| 4,250,570 A | 2/1981 | Tsang et al. |
| 4,599,705 A * | 7/1986 | Holmberg et al. ............ 365/163 |
| 5,694,047 A * | 12/1997 | Goetting et al. ............. 324/705 |
| 2005/0188287 A1 * | 8/2005 | Combs et al. ............... 714/718 |
| 2006/0268485 A1 * | 11/2006 | Yanagida .................. 361/104 |
| 2006/0268616 A1 * | 11/2006 | Knopf et al. ............. 365/185.18 |
| 2007/0053230 A1 * | 3/2007 | Kanno ....................... 365/200 |

* cited by examiner

*Primary Examiner*—Timothy J Dole
*Assistant Examiner*—Benjamin M Baldridge
(74) *Attorney, Agent, or Firm*—Slater & Matsil, L.L.P.

(57) ABSTRACT

A method of testing a fuse element for a memory device is provided. A first test probe is electrically connected to a program terminal of the memory device. A second test probe is electrically connected to a ground terminal. The fuse element is on an electrical circuit path between the program terminal and the ground terminal. The first and second test probes are electrically connected to a testing device. A first voltage is applied with the testing device between the program terminal and the ground terminal. At least part of a first current of the first voltage flows across the fuse element. The first voltage and the at least part of the first current that flows across the fuse element is not large enough to change the conductivity state of the fuse element. The first current is measured and used to evaluated the conductive state of the fuse element.

20 Claims, 11 Drawing Sheets

METHODS OF TESTING FUSE ELEMENTS FOR MEMORY DEVICES

TECHNICAL FIELD

The present invention generally relates to methods of testing fuse elements of memory devices. In one aspect it relates more particularly to measuring resistance across a fuse element in a memory device using a program terminal.

BACKGROUND

A memory array, such as a programmable read only memory array (PROM) or a random access memory array (RAM), generally includes an array of binary elements arranged in a matrix of rows and columns having addresses associated therewith and decoders coupled thereto. PROM and RAM devices have been used in electronics, telecommunications, and computer industries for many years.

In a PROM device, the binary elements are permanently, semi-permanently, or temporarily programmed to one of two states so that information programmed in the memory may be read out quickly, but can only be programmed or written into the memory more slowly. Rather than producing a set of custom masks that manufacture a read only memory (ROM) device, a PROM device is typically manufactured instead. A PROM device includes one or more fuses and/or one or more antifuse elements, which allow the PROM to be programmed or written to. By selectively blowing fuses (opening a circuit path) or making antifuses conductive (closing a circuit path) for certain cells in an array of memory cells, a blank PROM can be easily programmed to become a customized ROM for certain applications. This allows PROM devices to be mass produced for a wide array of applications, thereby reducing production cost, increasing profits, and extending the useful life of the equipment used to make the PROM devices (improving return on capital investment).

In a RAM device, the binary elements can be programmed or written to and read out relatively quickly, but the memory must be continuously refreshed to retain the information therein. In the manufacturing of memory devices of all types, processing defects often randomly occur across the memory device. Typically, the memory device is still functional except that one or more rows and/or columns have a defective cell (defective bit). This has led to the development of memory devices having redundant elements (rows, columns, encoders, decoders, etc.) without addresses assigned yet. As needed, such redundant elements may be assigned the address of a defective row or column while the defective row or column is disabled. Such repairs and use of redundant elements are often provided by fuse elements that may be used to repair and reprogram addressing. For example, U.S. Pat. No. 4,250,570 discusses some conventional ways to repair memory devices using redundant elements.

It is desirable to test integrated circuit devices to determine whether a chip meets a manufacturing specification for performance, functionality, and reliability. Typically, finished integrated circuit chips are electrically tested prior to being cut from the wafer. Often a probe card having a set of test probes positioned to contact bond pads and/or test pads on the chips are used to perform such electrical tests. Also, devices may be tested after the chips are singulated from the wafer and/or after the chips are packaged (partially or completely). Chip packages may have any of a wide variety of layouts and designs, such as side pins, pin arrays, and ball grid arrays. There is a need to test fuse elements in memory devices. To test a fuse element in a memory device, often the device includes an extra terminal connected to the fuse element specifically for testing the fuse element. However, this extra test terminal is typically not used during normal operation of the device. Thus, it would be highly desirable to have a way to test the fuse elements in a memory device without the need for extra test terminals, which consume valuable chip real estate and require extra wiring in the metallization layers.

SUMMARY OF THE INVENTION

The problems and needs outlined above may be addressed by embodiments of the present invention. In accordance with one aspect of the present invention, a method of testing a fuse element for a memory device is provided. This method includes the following steps described in this paragraph. The order of the steps may vary, may be sequential, may overlap, may be in parallel, and combinations thereof, if not otherwise stated. A first test probe is electrically connected to a program terminal of the memory device. The program terminal is adapted for changing a conductive state of the fuse element for the memory device while programming the memory device. The first test probe is also electrically connected to a testing device such that the program terminal is electrically connected to the testing device via the first test probe. A second test probe is electrically connected to a ground terminal. The fuse element is on an electrical circuit path of the memory device between the program terminal and the ground terminal. The second test probe is also electrically connected to the testing device such that the ground terminal is electrically connected to the testing device via the second test probe. A first voltage is applied with the testing device between the program terminal and the ground terminal such that at least part of a first current of the first voltage flows across the fuse element. The first voltage and the at least part of the first current that flows across the fuse element are not large enough to change the conductivity state of the fuse element. The first current of the first voltage is measured with the testing device. The conductive state of the fuse element is evaluated based on the first current.

In accordance with another aspect of the present invention, a method of testing a memory device is provided. This method includes the following steps described in this paragraph. The order of the steps may vary, may be sequential, may overlap, may be in parallel, and combinations thereof, if not otherwise stated. A fuse element of the memory device is tested a first time. The first testing of the fuse element includes: electrically connecting a first test probe to a program terminal of the memory device, the program terminal being adapted for changing a conductive state of the fuse element for the memory device while programming the memory device, wherein the first test probe is also electrically connected to a testing device such that the program terminal is electrically connected to the testing device via the first test probe; electrically connecting a second test probe to a ground terminal, wherein the fuse element is on an electrical circuit path of the memory device between the program terminal and the ground terminal, and wherein the second test probe is also electrically connected to the testing device such that the ground terminal is electrically connected to the testing device via the second test probe; applying a first voltage with the testing device between the program terminal and the ground terminal such that at least part of a first current of the first voltage flows across the fuse element, wherein the first voltage and the at least part of the first current flowing across the fuse element is not large enough to change the conductivity state of the fuse element; measuring the first current of the first voltage with the testing device; and evaluating the conductive state of the fuse element based on the first current. Next, a reliability test is performed on the memory device. Then, the fuse element of the memory device is tested a second time after performing the reliability test. The second testing of the fuse element includes the same method as the first testing described above. The conductivity state of the fuse element from the first and second testings are compared to determine whether the fuse element was damaged during the reliability test.

In accordance with yet another aspect of the present invention, a method of making a memory device is provided. This method includes the following steps described in this paragraph. The order of the steps may vary, may be sequential, may overlap, may be in parallel, and combinations thereof, if not otherwise stated. A fuse element of the memory device is tested. The testing of the fuse element includes: electrically connecting a first test probe to a program terminal of the memory device, the program terminal being adapted for changing a conductive state of the fuse element for the memory device while programming the memory device, wherein the first test probe is also electrically connected to a testing device such that the program terminal is electrically connected to the testing device via the first test probe; electrically connecting a second test probe to a ground terminal, wherein the fuse element is on an electrical circuit path of the memory device between the program terminal and the ground terminal, and wherein the second test probe is also electrically connected to the testing device such that the ground terminal is electrically connected to the testing device via the second test probe; applying a first voltage with the testing device between the program terminal and the ground terminal such that at least part of a first current of the first voltage flows across the fuse element, wherein the first voltage and the at least part of the first current flowing across the fuse element is not large enough to change the conductivity state of the fuse element; measuring the first current of the first voltage with the testing device; and evaluating the conductive state of the fuse element based on the first current. Before or after testing the fuse element, the memory device is programmed.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
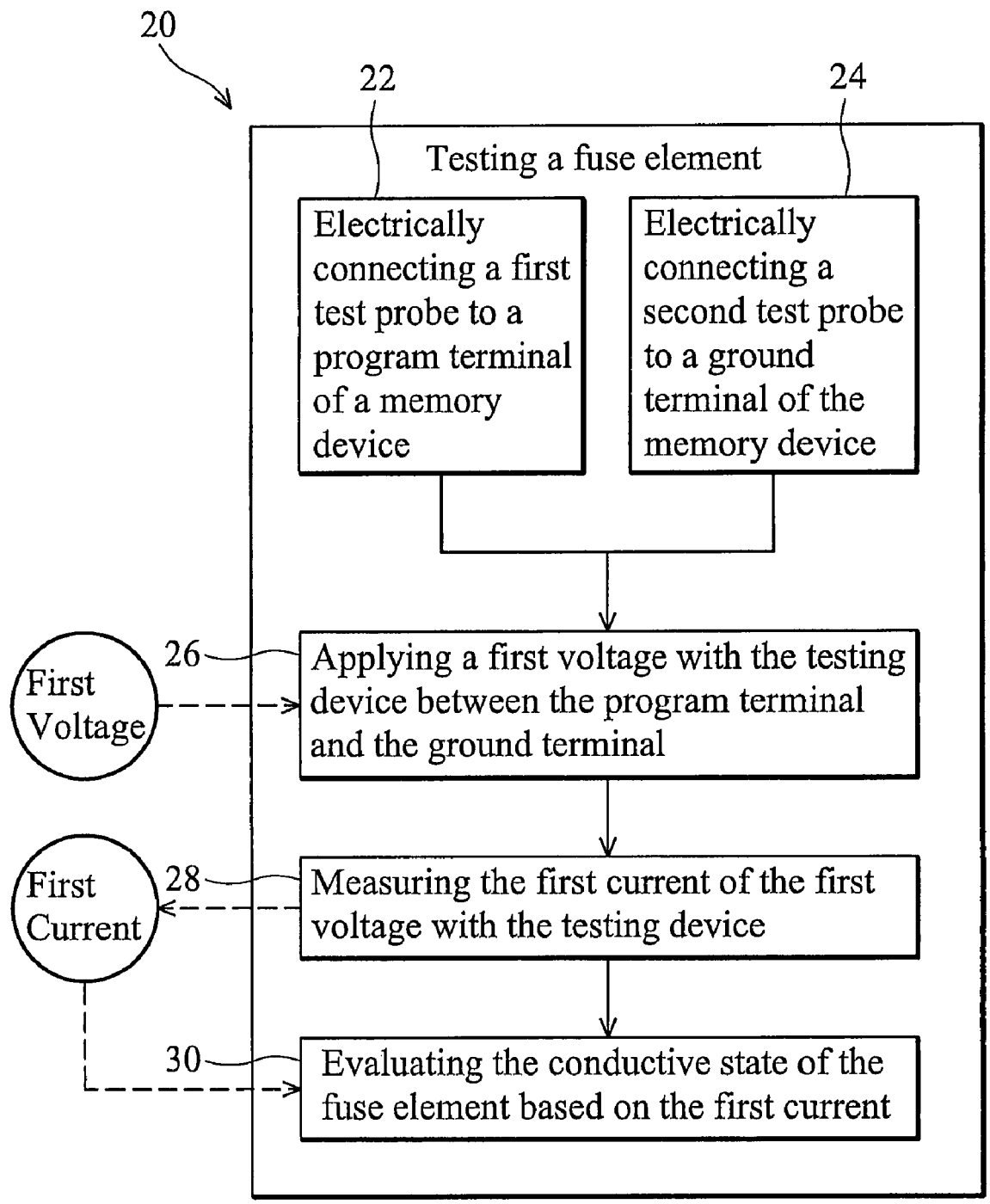
FIG. 1 is a flowchart showing a first illustrative method embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention includes a method of testing a fuse element for a memory device. FIG. 1 is a flowchart showing a first illustrative method embodiment of the present invention. More specifically, FIG. 1 shows a method 20 of testing a fuse element of a memory device. In this method of the first embodiment, a first test probe is electrically connected to a program terminal of the memory device (see block 22 in FIG. 1). The program terminal is adapted to be used for changing a conductive state of the fuse element while programming the memory device. The first test probe is electrically connected to a testing device, and hence the program terminal is electrically connected to the testing device via the first probe. Also, a second test probe is electrically connected to a ground terminal of the memory device (see block 24 in FIG. 1). The fuse element is on an electrical circuit path in the memory device (e.g., in a cell of the memory device, in an address bit of the memory device, to a cell of the memory device, from a cell of the memory device, etc.) between the program terminal and the ground terminal (note that there may be many other components along that same circuit path as well, such as a resistor, transistor, capacitor, doped semiconductor, contact silicide, intermetal conductive line, bond pad, etc.). Examples of circuit paths will be discussed further below with reference to FIGS. 5A-11.

To test the fuse element, a first voltage is applied with the testing device between the program terminal and the ground terminal (see block 26 in FIG. 1). During the applying of the first voltage, at least part of a first current of the first voltage flows across the fuse element, but the first voltage and the portion of the first current flowing across the fuse element is not large enough to change the conductive state of the fuse element (e.g., not large enough to damage or blow the fuse element). The first current of the first voltage is measured with the testing device (see block 28 in FIG. 1). With the first current measured and knowing the first voltage applied, the conductive state of the fuse element is evaluated (e.g., to determine if the fuse element is defective) (see block 30 in FIG. 1).

As will be discussed more below with reference to FIGS. 5A-11, the fuse element may be at a variety of connected locations relative to other components of the memory device. The memory device of an embodiment may be part of any suitable type of integrated circuit device that includes one or more memory bits or cells. For example, the memory device of an embodiment may be part of RAM, DRAM, SRAM, Flash, PROM, EEPROM, EAPROM, BIOS, or any other memory array that may utilize a fuse element. As another example, the memory device of an embodiment may be a memory cell that is part of a logic device. As yet another example, the memory device of an embodiment may be a memory cell that is part of a system on an integrated circuit chip. Because memory cells and memory devices that store bits of information have many types, forms, structures, and designs, and may be inserted into any suitable integrated circuit, the term "memory device" as used herein is not to limited to any particular semiconductor device nor any particular type of memory. Instead, the term "memory device" is used most broadly herein to refer to any component or portion of a semiconductor device that is used to store one or more bits of information (e.g., static, dynamic, magnetic, permanent, erasable, etc.). A fuse element of an embodiment may be a core part of the memory device (e.g., permanent PROM); may be used for changing an address designation for a memory cell, memory row, or memory column; may be used to enable or disable part of a memory array (e.g., redundant memory row, redundant memory column, redundant memory cell); or any other suitable use of a fuse element with or in a memory device. A fuse element of an embodiment may be any suitable design or type of fuse, anti-fuse, or fuse/anti-fuse combination, including (but not limited to): fuse designed to be blown or burned open by a large current and/or large voltage; fuse designed to have a higher resistance or non-conductive after programming it; antifuse designed to become conductive or more conductive after programming it; and combinations thereof.

Figure 2:
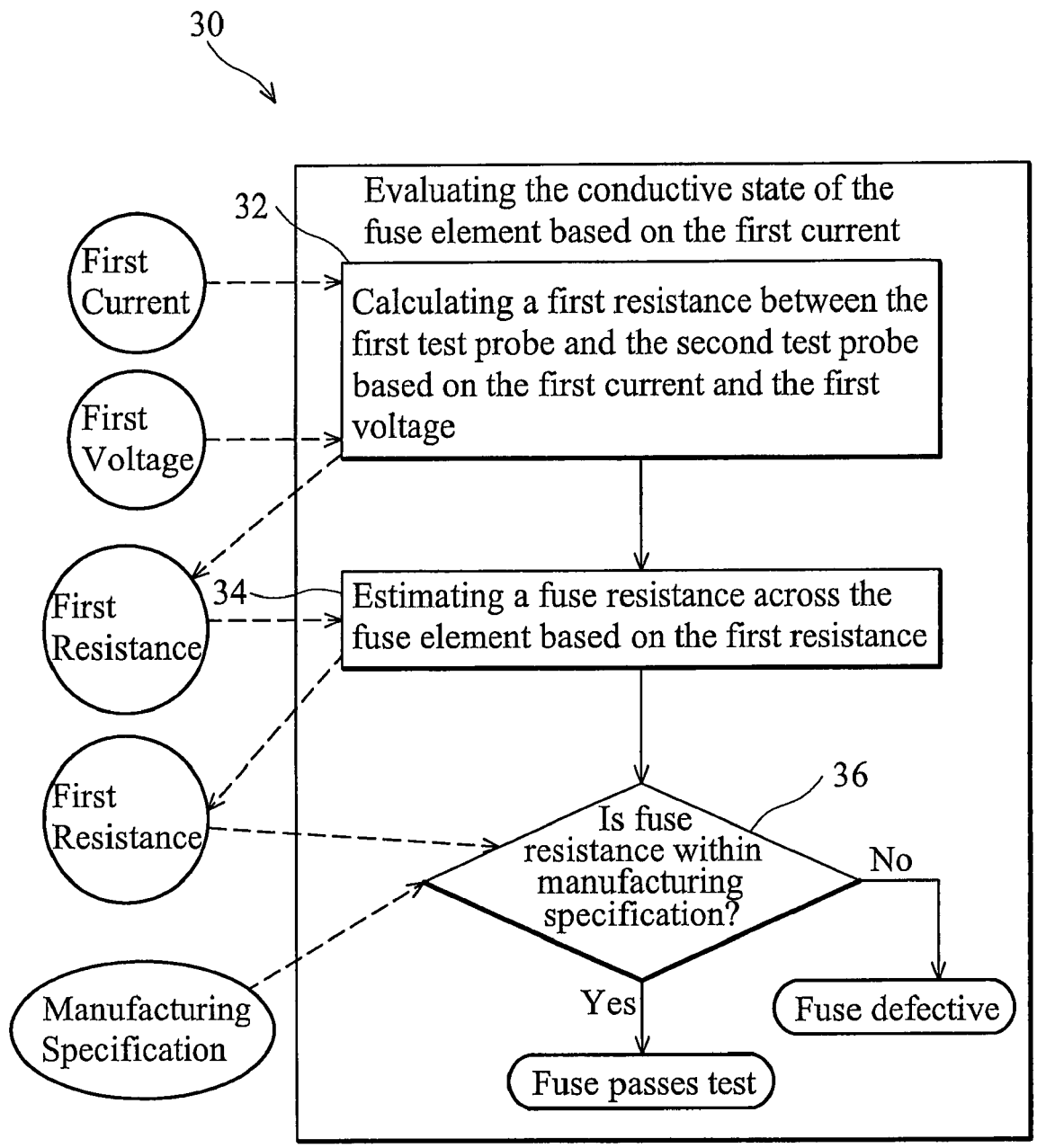
FIG. 2 is a flowchart showing an illustrative method of evaluating the conductive state of the fuse element for FIG. 1.

In accordance with a first illustrative embodiment of the present invention, FIG. 2 is a flowchart further expanding upon a way to evaluate the conductive state of the fuse element (block 30 in FIG. 1). A first resistance may be calculated between the first test probe and the second test probe based on the first current and the first voltage (e.g., R=V/I) (see block 32 in FIG. 2). With the first resistance, the resistance across the fuse element may be estimated (see block 34 in FIG. 2). Of course, this will require a knowledge of the other expected resistances along the circuit path (based on what components are along the path). The expected resistance between the program terminal and the ground terminal, or an acceptable range for the manufacturing specification, may be determined through experimentation and/or simulation, for example. Next in FIG. 2, it is determined whether the estimated fuse resistance is within the manufacturing specification (e.g., not exceeding an allowable range) (see decision block 36 in FIG. 2). If the estimated fuse resistance is not within the manufacturing specification, then the fuse element may be defective (i.e., the inappropriate resistance measurement may be due to failure of another element along the same circuit path). But if the estimated fuse resistance is within the manufacturing specification, then the fuse element passes this test (and is most likely not damaged or defective). In other embodiments, the conductive state of the fuse element may be assessed in a different way (e.g., using a different algorithm or logic sequence) based on the first current. FIG. 2 is merely an illustrative example of such evaluating.

Figure 3:
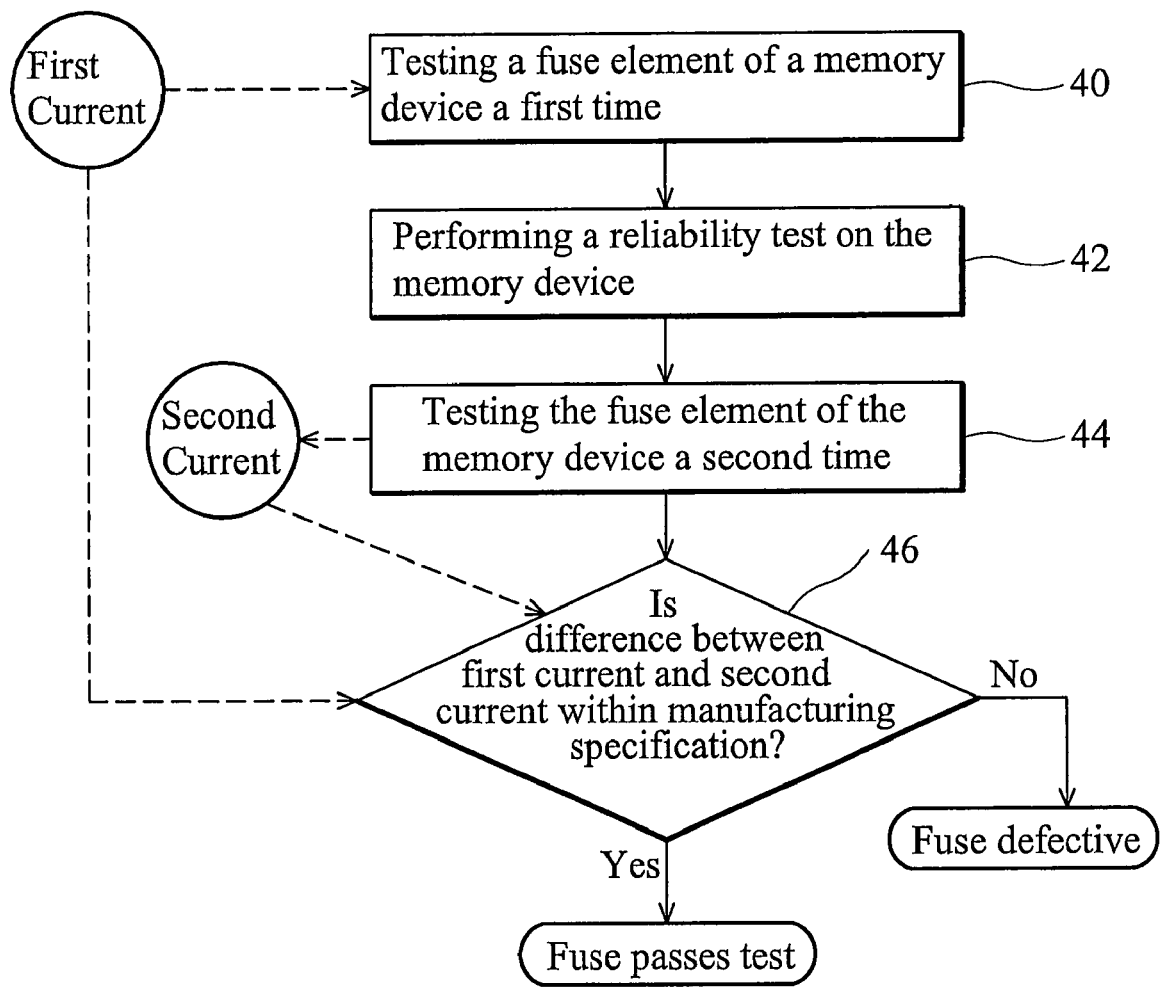
FIG. 3 is a flowchart showing a second illustrative method embodiment of the present invention.

Sometimes a fuse element may be damaged during a reliability test performed on the memory device (or a reliability test performed on the logic device, circuit, or system that the memory device is part of or connected to). FIG. 3 shows a flowchart for a second illustrative embodiment including a method of the present invention. In the second embodiment, the fuse test of the first embodiment (see test 20 in FIG. 1), for example, is used to test a fuse element before and after a reliability test to assess whether a significant change to the conductivity state of the fuse element occurred as a result of the reliability test. Referring to FIG. 3, a subject fuse element is tested a first time (using the method of FIG. 1, or FIGS. 1 and 2) (see block 40 in FIG. 3). After the first testing, a first current measurement is provided. Next, a reliability test is performed on the memory device (or a reliability test performed on the logic device, circuit, or system that the memory device is part of or connected to) (see block 42 in FIG. 3). Then at some point after the reliability test (or reliability tests), the subject fuse element is tested a second time (again using the method of FIG. 1, or FIGS. 1 and 2) (see block 44 in FIG. 3). After the second testing, a second current measurement is provided. With the first and second measured currents, it is determined whether the difference between the first and second currents is within a manufacturing specification (which may be determined by experimentation and/or simulation, for example) (see decision block 46 in FIG. 3). If the difference is not within the manufacturing specification, then the fuse element may have been damaged during the reliability test(s) (unless some other component along the circuit path is causing the difference in current measurements). In other words, the fuse element (or its circuit path) fails these tests and the device may be defective or damaged. If the difference is within the manufacturing specification, then the fuse element is most likely undamaged by the reliability test(s) and passes the testing of the second embodiment testing method.

Figure 4A:
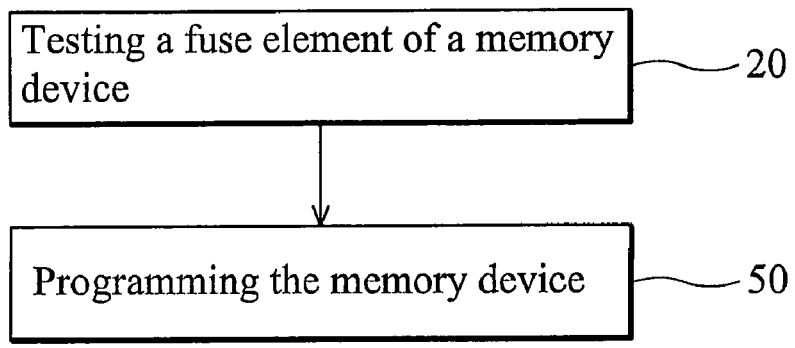
FIG. 4A is a flowchart showing a third illustrative method embodiment of the present invention.
Figure 4B:
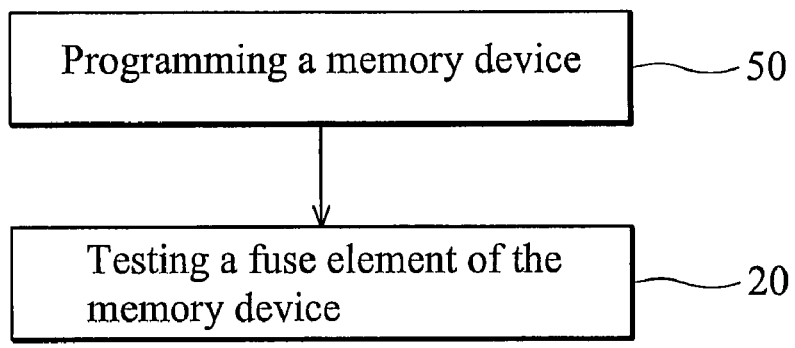
FIG. 4B is a flowchart showing a fourth illustrative method embodiment of the present invention.
Figure 4C:
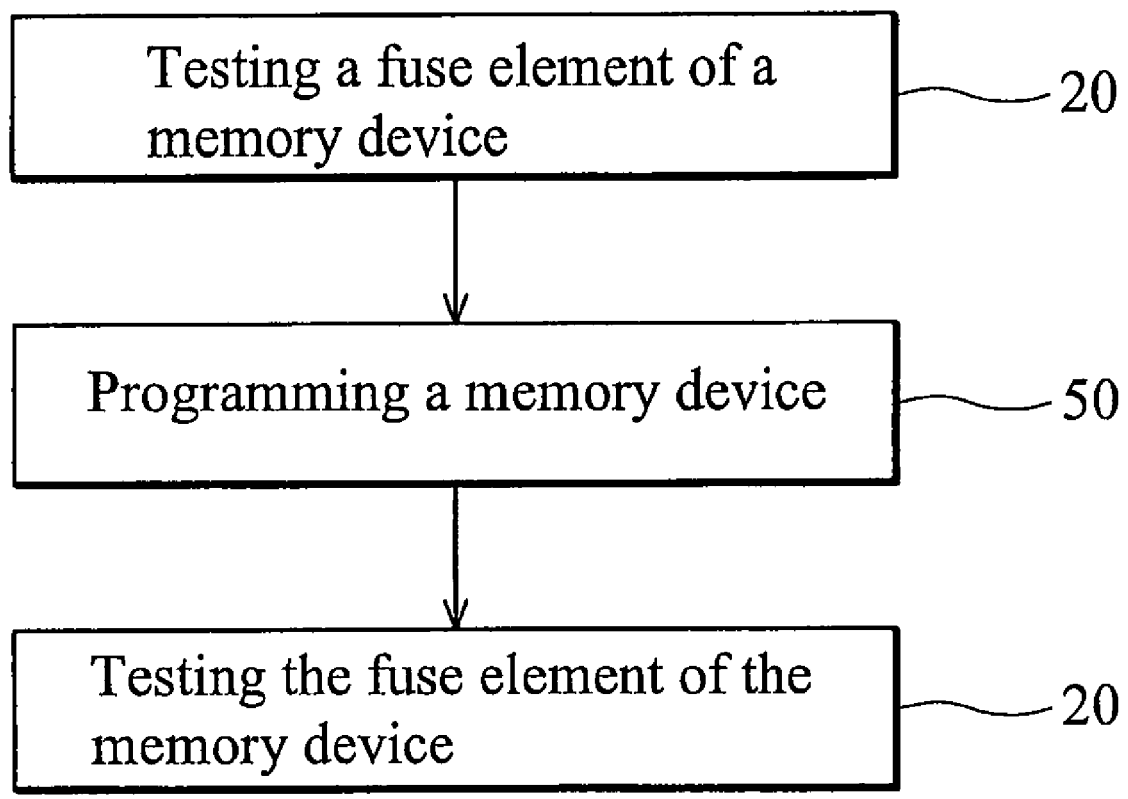
FIG. 4C is a flowchart showing a fifth illustrative method embodiment of the present invention.

It would be desirable to test the conductive state of fuse elements in a memory device prior to programming the memory device (and/or after programming the memory device). FIG. 4A shows a flowchart for a third illustrative embodiment including a method of the present invention. In the third embodiment, the fuse test of the first embodiment, for example, is used to test a fuse element of a memory device (see block 20 in FIG. 4A) before the memory device is programmed (see block 50 in FIG. 4A). In a fourth embodiment, the fuse element is tested after the memory device is programmed (see FIG. 4B). In a fifth embodiment, the fuse element is tested before and after the memory device is programmed (see FIG. 4C). The programming of the memory device (block 50 in FIGS. 4A-4C) may be any suitable programming activity, including (but not necessarily limited to): programming a binary state of a memory cell in the memory device, wherein the programming of the binary state of the memory cell includes changing the conductive state of the fuse element; repairing the memory device, wherein the repairing includes assigning an address to a redundant element, and wherein the assigning of the address comprises changing the conductive state of the fuse element; repairing the memory device, wherein the repairing includes disabling a defective element, and wherein the disabling of the defective element comprises changing the conductive state of the fuse element; or combinations thereof, for example. In a preferred embodiment, the same device used to program the memory device is used as the testing device, especially since the testing device is already electrically connected for programming (by being electrically connected to the program terminal and the ground terminal).

Figure 5A:
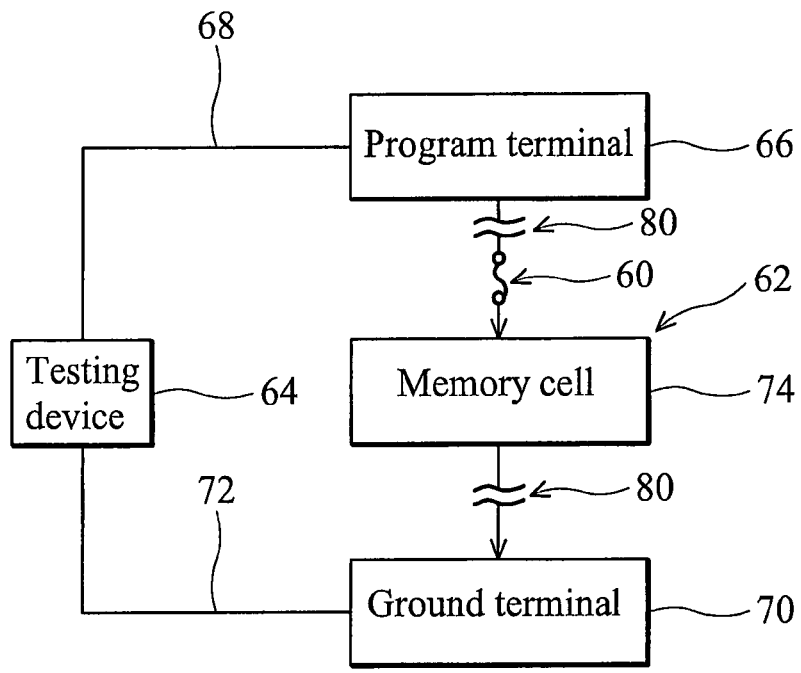
FIGS. 5A-11 are simplified schematics showing illustrative ways a fuse element may be electrically connected between a program terminal and a ground terminal.
Figure 5B:
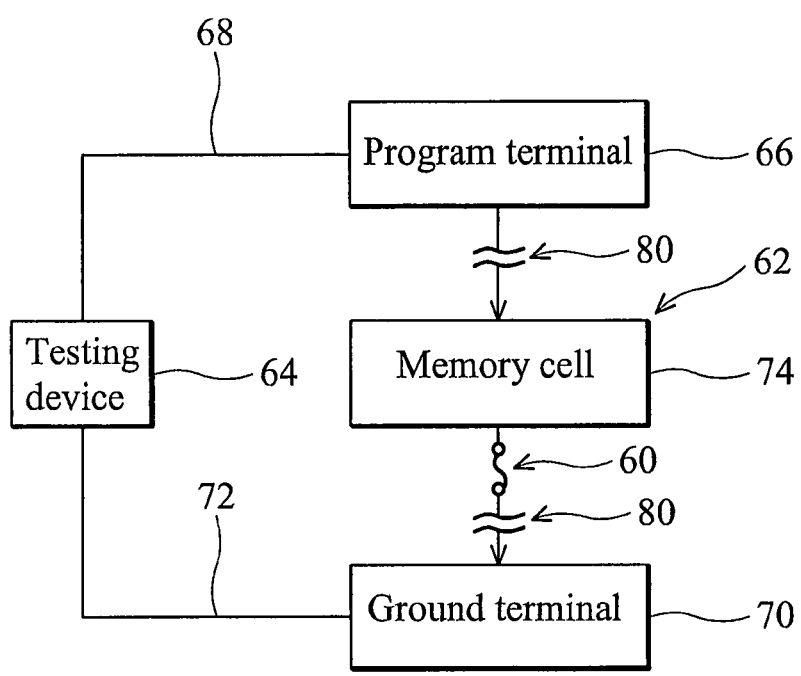

FIGS. 5A-11 illustrate some example wiring schematics, which are simplified for purposes of illustration, showing that a fuse element 60 of an embodiment may be at a variety of connected locations relative to other components of the memory device 62. Beginning with FIG. 5A, a testing device 64 is electrically connected to a program terminal 66 by a first probe 68 and is electrically connected to a ground terminal 70 by a second probe 72. The fuse element 60 of FIG. 5A is located along a circuit path between a memory cell 74 (of the memory device 62) and the program terminal 66. The schematic notations 80 shown in FIGS. 5A-11 show that there may or may not be other devices, components, circuit branches, and elements along that circuit path, which are not shown for purposes of simplifying the drawings. There may be other terminals (not shown) that may need to be probed and activated (e.g., providing an electrical field to a gate electrode of a transistor to switch on/off the transistor) to allow a current to flow through the fuse element 60 for some configurations. Back to FIG. 5A, the memory cell 74 is electrically connected to the ground terminal 70. Hence, the fuse element 60 is along an electrical circuit path between the program terminal 66 and the ground terminal 70 (i.e., between the first and second probes 68, 72). FIG. 5B is similar to FIG. 5A, except that the subject fuse element 60 is located between the memory cell 74 and the ground terminal 70. In other electrical schematics for an embodiment, there may be two or more subject fuse elements 60 along a given circuit path tested between the program terminal 66 and the ground terminal 70. For simplification, only one fuse element 60 is shown in each of FIGS. 5A-11, even though there may be other fuse elements at notations 80.

Figure 6A:
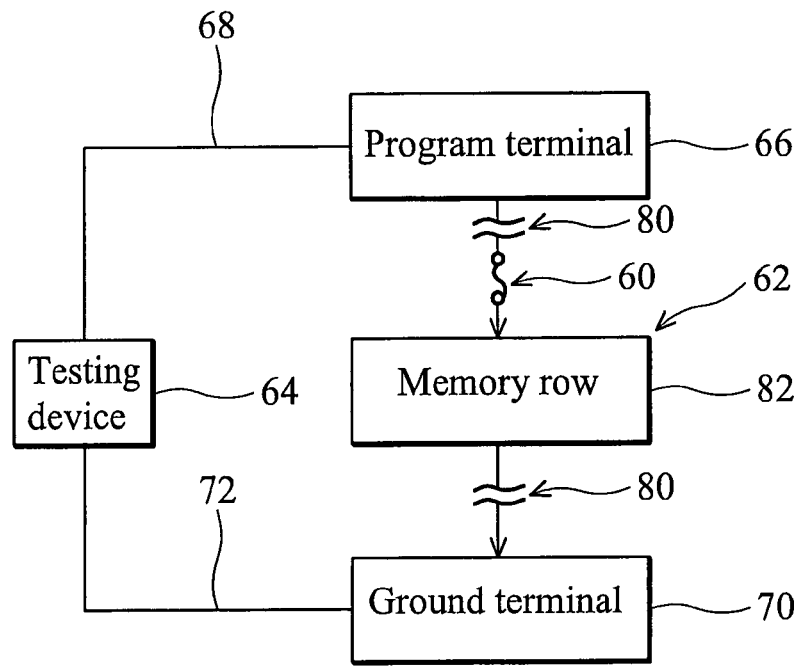
Figure 6B:
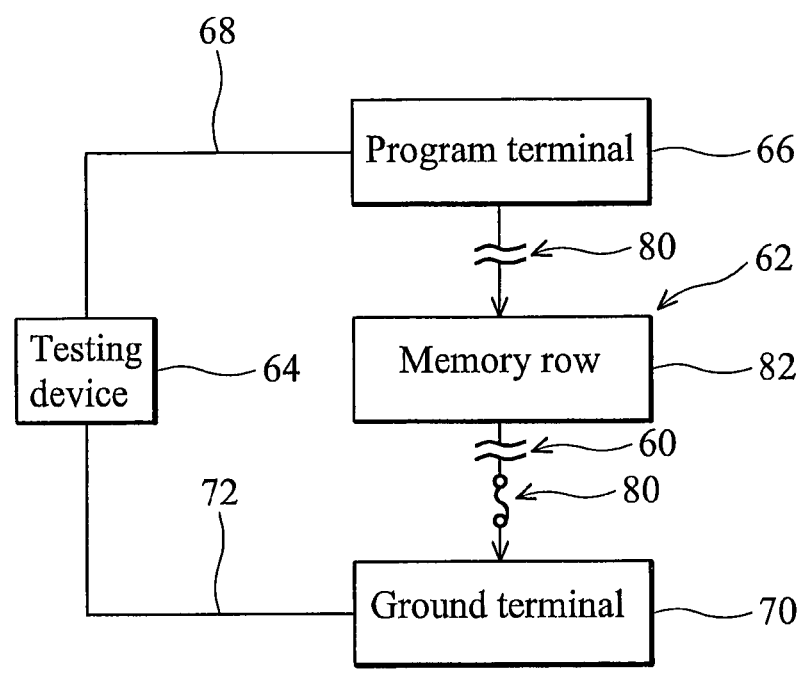
Figure 7A:
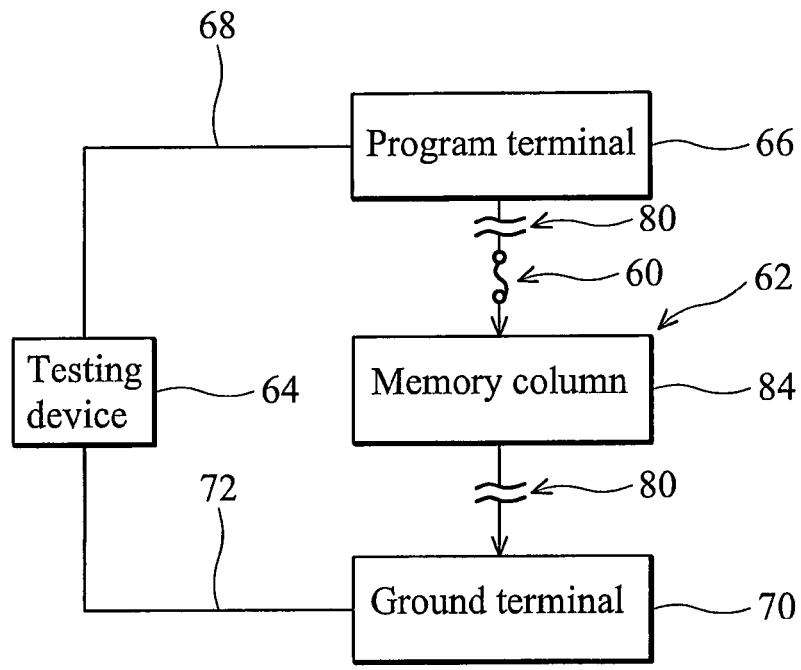
Figure 7B:
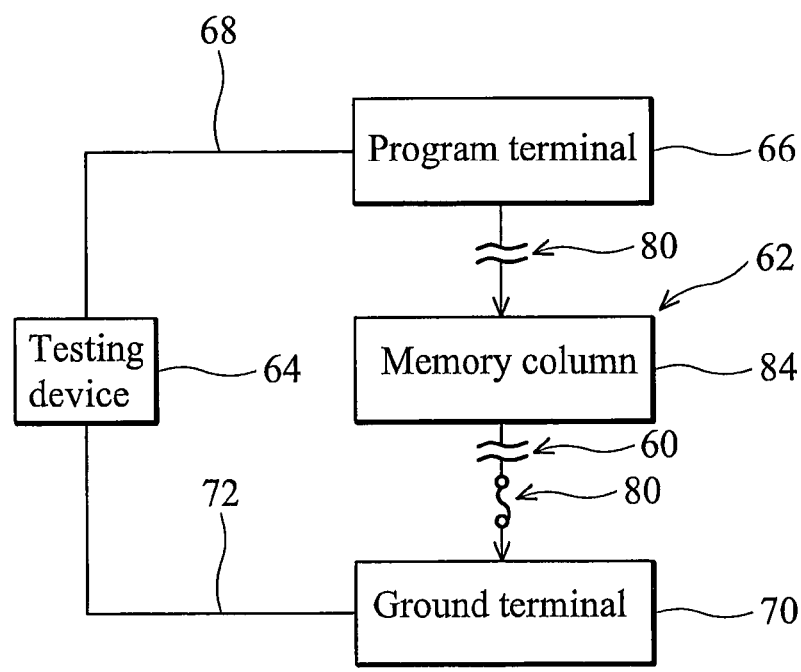

In each of FIGS. 6A and 6B, the fuse element 60 is electrically connected to a memory row 82. This may be a case where the memory device 62 has one or more redundant memory rows for repairing a defective memory row. Hence, the memory row 82 of FIGS. 6A and 6B may be an original memory row or a redundant memory row (which may be activated/deactivated by blowing the fuse element 60, for example). Similarly in each of FIGS. 7A and 7B, the fuse element 60 is electrically connected to a memory column 84. This may be a case where the memory device 62 has one or more redundant memory columns for repairing a defective memory column. Hence, the memory column 84 of FIGS. 7A and 7B may be an original memory column or a redundant memory column (which may be activated/deactivated by blowing the fuse element 60, for example).

Figure 8A:
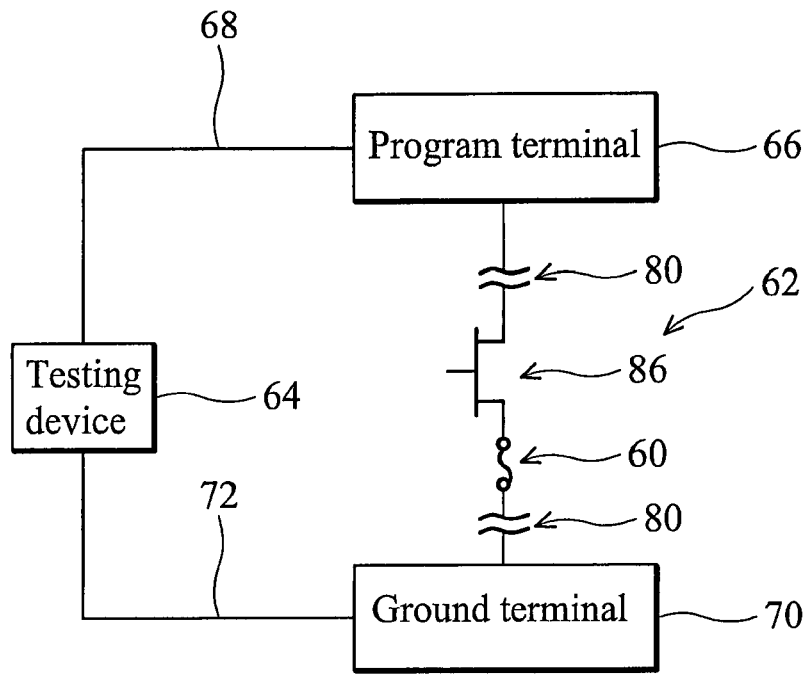
Figure 8B:
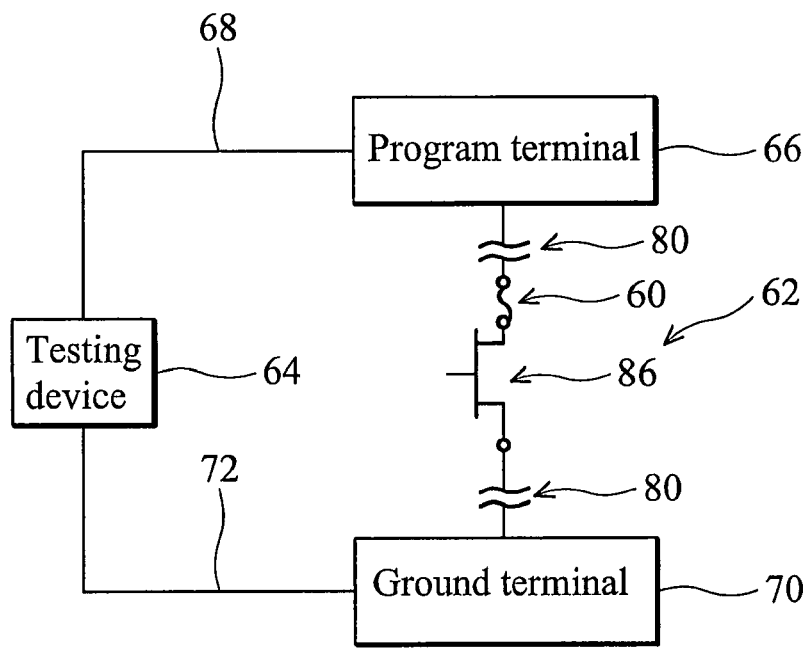
Figure 9A:
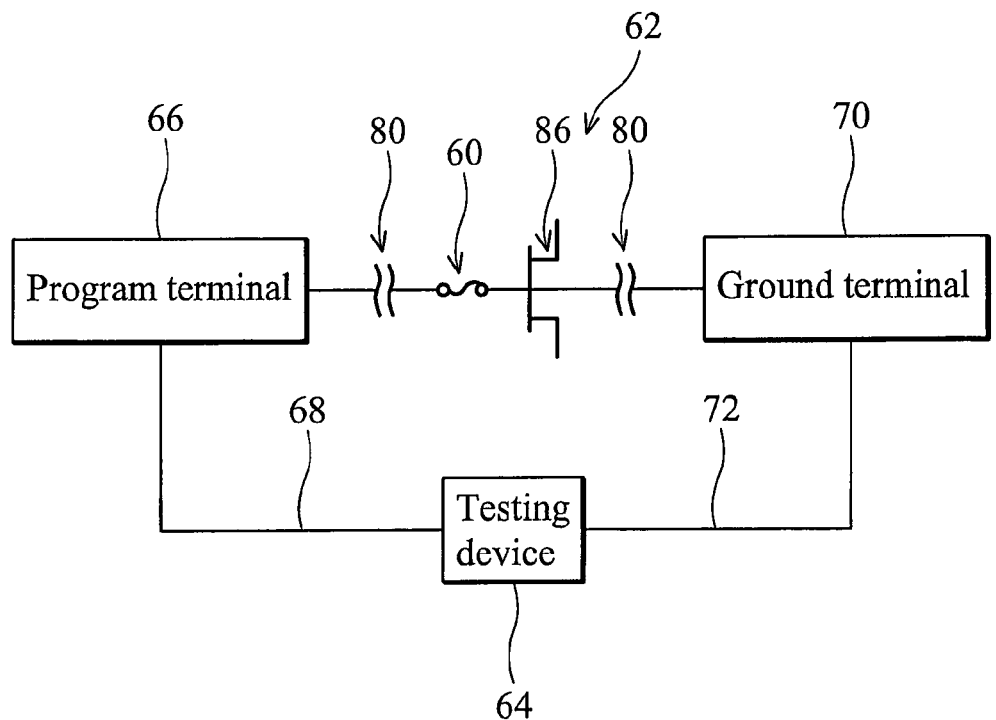
Figure 9B:
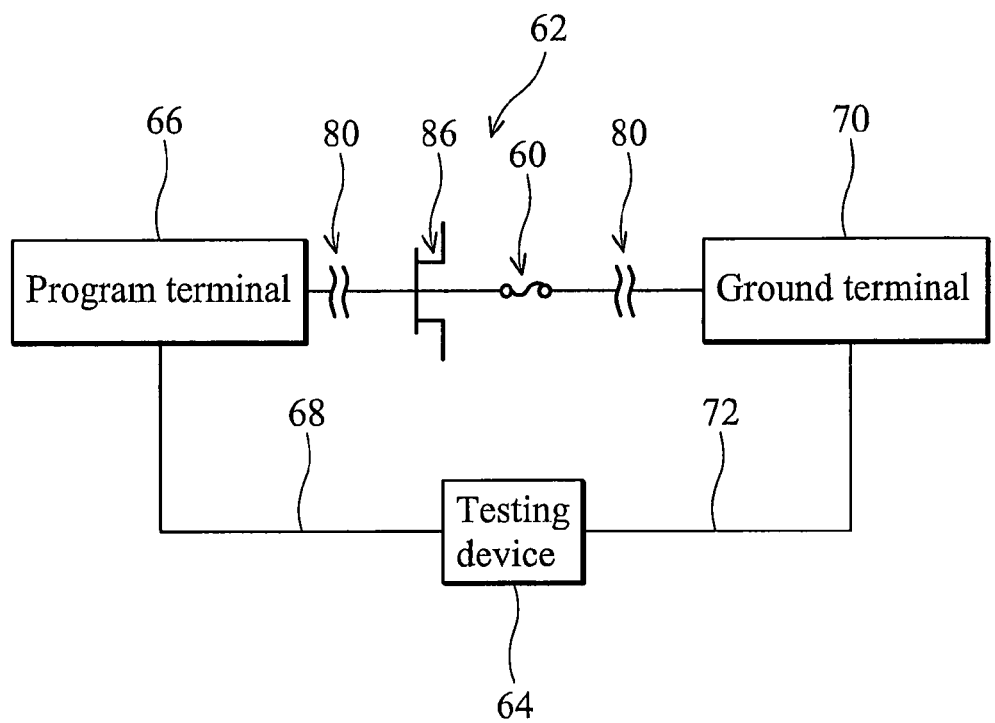

Each of FIGS. 8A and 8B shows a fuse element 60 electrically connected to a source/drain of a transistor 86. This transistor 86 may be any suitable type (e.g., PMOS, NMOS) or design of transistor currently known or later developed. This is a case where a probe (not shown) from the testing device 64 may be needed to switch the transistor on/off during the testing of the fuse element 60 to allow the current to flow through the fuse element 60 via the transistor 86. Each of FIGS. 9A and 9B shows a fuse element 60 electrically connected to a gate electrode or a substrate (to ground) of a transistor 86, as another example.

Figure 10:
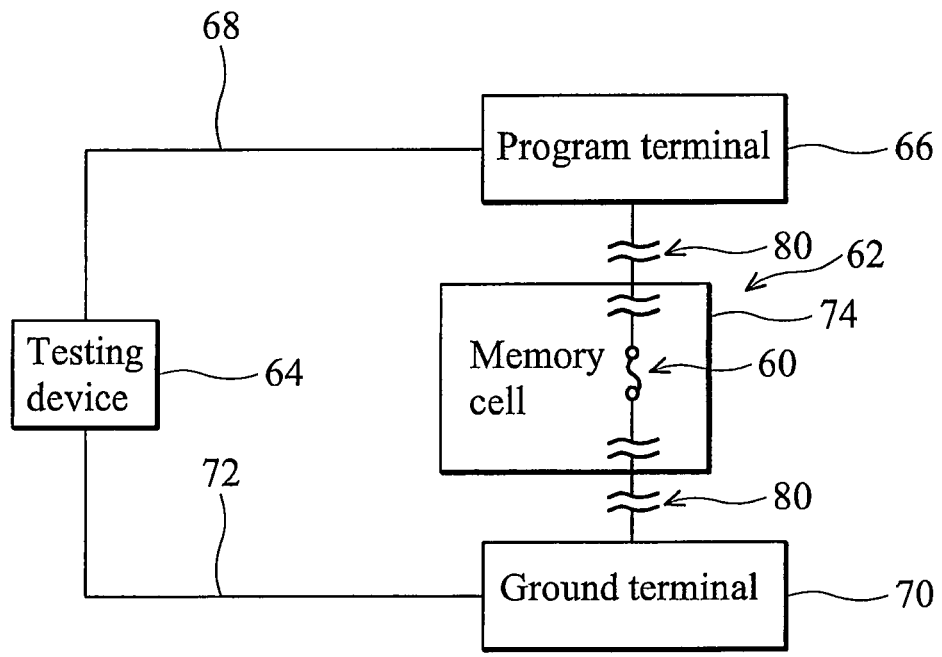
Figure 11:
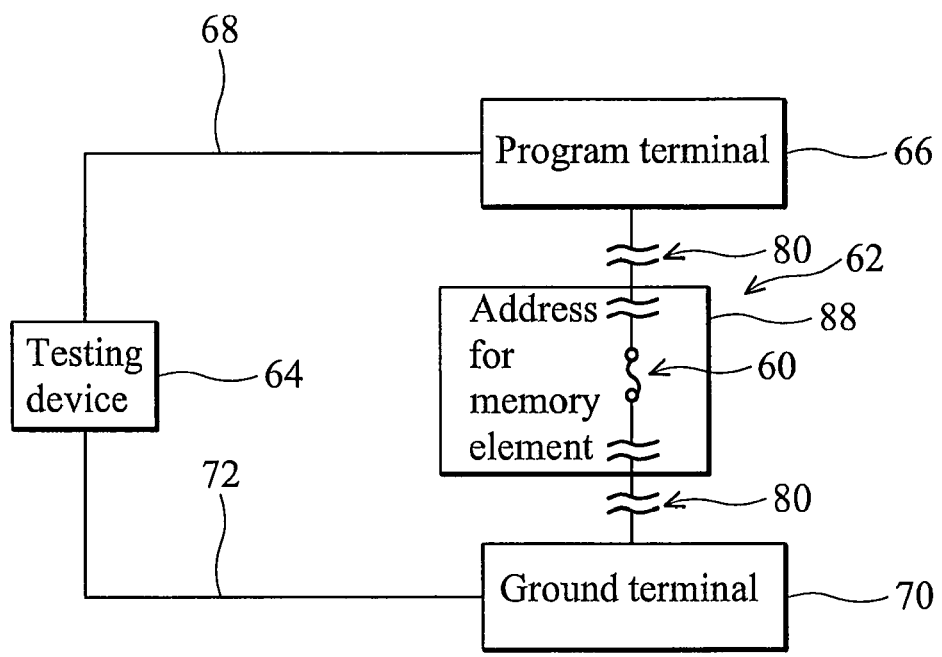

FIG. 10 shows a fuse element 60 within a memory cell 74 of a memory device 62. FIG. 11 shows a fuse element 60 used in addressing 88 (e.g., for activating a redundant memory cell, row, or column) (e.g., for deactivating a defective memory cell, row, or column) (e.g., for assigning an address to an element during programming or repairing of a memory device 62). Thus, as illustrated by the illustrative examples of FIGS. 5A-11, a fuse element 60 tested using a method embodiment of the present invention may be located at any suitable location within a semiconductor device, integrated circuit, or system.

An embodiment of the present invention may provide advantages, including (but not necessarily limited to) any of the following:

Allowing the apparatus and probe card normally used for programming a memory device to be easily adapted for testing fuse elements;

Providing a way to test fuse elements without the need for additional terminals used only for testing fuse elements;

Providing a way to ensure that fuse elements are not damaged after reliability testing;

Providing a way to test fuse elements using existing probe devices that are normally used for programming the memory devices;

Providing a way to test fuse elements for integrated circuits with a high density of electrical fuse elements;

Allowing for shorter development time and shorter debug time during research and development of fuse elements, saving research and development money and providing products to customers sooner;

Providing a way to measure fuse elements randomly and also providing yield debug and monitoring;

Providing a way to conveniently and efficiently test high capacity electrical fuses (e.g., great than 1K);

During research and development, the resistance testing of the fuse element at the chip probing stage and burn-in stage is helpful in selecting proper fuse elements, as well as helping to understand the programming and regrow behavior of fuse elements;

May be used for collecting the resistance distribution of an entire chip and randomly measuring a failing bit's resistance as helpful for yield debugging at the production stage; and/or Providing information and may be helpful in developing a program condition choice based on any measured changes in the fuse element's conductivity at different stages;

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing a fuse element of a memory device, comprising:

electrically connecting a first test probe to a program terminal of the memory device, the program terminal being adapted for changing a conductive state of the fuse element of the memory device while programming the memory device, and also adapted for testing the memory device during normal operation, wherein the memory device is both programmed and tested through the program terminal during normal operation, and wherein the first test probe is also electrically connected to a testing device such that the program terminal is electrically connected to the testing device via the first test probe;

electrically connecting a second test probe to a ground terminal, wherein the fuse element is on an electrical circuit path of the memory device between the program terminal and the ground terminal, and wherein the second test probe is also electrically connected to the testing device such that the ground terminal is electrically connected to the testing device via the second test probe;

applying a first voltage with the testing device between the program terminal and the ground terminal such that at least part of a first current resulting from the first voltage flows across the fuse element, wherein the first voltage and the at least part of the first current flowing through the fuse element is not large enough to change the conductivity state of the fuse element;

measuring the first current of the first voltage with the testing device; and evaluating the conductive state of the fuse element based on the first current.

2. The method of claim 1, wherein the evaluating of the conductive state of the fuse element comprises:

calculating a first resistance between the first test probe and the second test probe based on the first current and the first voltage;

estimating a fuse resistance across the fuse element based on the first resistance; and comparing the estimated fuse resistance to a manufacturing specification to determine whether the fuse element meets the manufacturing specification.

3. The method of claim 1, wherein at least one transistor is located in the electrical circuit path between the fuse element and the program terminal.

4. The method of claim 3, wherein a substrate of the at least one transistor is coupled to the fuse element.

5. The method of claim 1, wherein at least one transistor is located in the electrical circuit path between the fuse element and the ground terminal.

6. The method of claim 1, wherein the memory device comprises a programmable read only memory device.

7. The method of claim 1, wherein the memory device comprises an electrically alterable read only memory device.

8. The method of claim 1, wherein the memory device comprises a random access memory device.

9. The method of claim 1, wherein the memory device is part of a programmable logic device.

10. The method of claim 1, wherein the memory device is part of a system on an integrated circuit chip.

11. The method of claim 1, wherein the fuse element is electrically connected to a redundant memory cell.

12. The method of claim 1, wherein the fuse element is adapted to be blown by a second current and a second voltage applied between the program terminal and the ground terminal.

13. The method of claim 1, wherein the programming of the memory device comprises programming a binary state of a memory cell in the memory device, wherein the programming of the binary state of the memory cell comprises changing the conductive state of the fuse element.

14. The method of claim 1, wherein the programming of the memory device comprises repairing the memory device, wherein the repairing comprises assigning an address to a redundant element, and wherein the assigning of the address comprises changing the conductive state of the fuse element.

15. The method of claim 1, wherein the programming of the memory device comprises repairing the memory device, wherein the repairing comprises disabling a defective element, and wherein the disabling of the defective element comprises changing the conductive state of the fuse element.

16. A method of testing a memory device, comprising:

testing a fuse element of the memory device a first time, the first testing of the fuse element comprising:

electrically connecting a first test probe to a program terminal of the memory device, the program terminal being adapted for changing a conductive state of the fuse element of the memory device while programming the memory device and also being adapted to supply a first voltage to the fuse element during testing, wherein the first test probe is also electrically connected to a testing device such that the program terminal is electrically connected to the testing device via the first test probe, electrically connecting a second test probe to a ground terminal, wherein the fuse element is part of an electrical circuit path of the memory device between the program terminal and the ground terminal, and wherein the second test probe is also electrically connected to the testing device such that the ground terminal is electrically connected to the testing device via the second test probe, applying the first voltage with the testing device between the program terminal and the ground terminal such that at least part of a first current resulting from the first voltage flows through the fuse element, wherein the first voltage and the at least part of the first current flowing through the fuse element is not large enough to change the conductivity state of the fuse element, measuring the first current resulting from the first voltage with the testing device, and evaluating the conductive state of the fuse element based on the first current;

performing a reliability test on the memory device;

testing the fuse element of the memory device a second time after performing the reliability test, the second testing of the fuse element comprising a same method as the first testing; and comparing the conductivity state of the fuse element from the first and second testings to determine whether the fuse element was damaged during the reliability test.

17. A method of making a memory device comprising:

testing a fuse element of the memory device, the testing of the fuse element comprising:

electrically connecting a first test probe to a program terminal of the memory device, the program terminal being adapted for changing a conductive state of the fuse element for the memory device while programming the memory device, and also adapted for testing the memory device during normal operation, wherein the memory device is both programmed and tested through the program terminal during normal operation, and wherein the first test probe is also electrically connected to a testing device such that the program terminal is electrically connected to the testing device via the first test probe, electrically connecting a second test probe to a ground terminal, wherein the fuse element is part of an electrical circuit path of the memory device between the program terminal and the ground terminal, and wherein the second test probe is also electrically connected to the testing device such that the ground terminal is electrically connected to the testing device via the second test probe, applying a first voltage with the testing device between the program terminal and the ground terminal such that at least part of a first current resulting from the first voltage flows through the fuse element, wherein the first voltage and the at least part of the first current flowing through the fuse element is not large enough to change the conductivity state of the fuse element, measuring the first current of the first voltage with the testing device, and evaluating the conductive state of the fuse element based on the first current; and programming the memory device.

18. The method of claim 17, wherein the programming of the memory device comprises programming a binary state of a memory cell in the memory device, wherein the programming of the binary state of the memory cell comprises changing the conductive state of the fuse element.

19. The method of claim 17, wherein the programming of the memory device comprises repairing the memory device, wherein the repairing comprises assigning an address to a redundant element, and wherein the assigning of the address comprises changing the conductive state of the fuse element.

20. The method of claim 17, wherein the programming of the memory device comprises repairing the memory device, wherein the repairing comprises disabling a defective element, and wherein the disabling of the defective element comprises changing the conductive state of the fuse element.

* * * * *